US008968487B2

(12) United States Patent
Bang et al.

(10) Patent No.: US 8,968,487 B2
(45) Date of Patent: Mar. 3, 2015

(54) WAFER CONTAINER CLEANING DEVICE

(75) Inventors: In Ho Bang, Chungnam (KR); Bum Sun Park, Chungnam (KR); Bong Jin Choi, Chungnam (KR)

(73) Assignee: Deviceeng Co., Ltd. (KR)

( * ) Notice: Subject to any disclaimer, the term of this patent is extended or adjusted under 35 U.S.C. 154(b) by 1053 days.

(21) Appl. No.: 13/012,571

(22) Filed: Jan. 24, 2011

(65) Prior Publication Data

US 2011/0284038 A1 Nov. 24, 2011

(30) Foreign Application Priority Data

May 18, 2010 (KR) .............................. 10-2010-46470

(51) Int. Cl.
*B08B 3/02* (2006.01)
*B08B 9/00* (2006.01)
*H01L 21/67* (2006.01)
*H01L 21/673* (2006.01)

(52) U.S. Cl.
CPC . *B08B 3/022* (2013.01); *B08B 9/00* (2013.01); *H01L 21/67051* (2013.01); *H01L 21/6735* (2013.01)
USPC .................................................... 134/166 R

(58) Field of Classification Search
CPC .................. H01L 21/67051; H01L 21/67028; H01L 21/6704; B08B 3/02; B08B 3/022; B08B 9/08; B08B 9/00; B08B 9/0861; B08B 9/093; B08B 9/0821
USPC ........................................ 134/166 R; 362/294
See application file for complete search history.

(56) References Cited

U.S. PATENT DOCUMENTS

| 5,551,670 | A | * | 9/1996 | Heath et al. ...................... 266/87 |
| 5,718,319 | A | * | 2/1998 | Gih .............................. 198/323 |
| 5,738,128 | A | * | 4/1998 | Thompson et al. .......... 134/95.2 |
| 6,797,076 | B1 | * | 9/2004 | Bryer .............................. 134/33 |
| 2002/0046760 | A1 | * | 4/2002 | Halbmaier ............... 134/167 R |
| 2006/0185692 | A1 | * | 8/2006 | Moran et al. ................ 134/25.4 |
| 2007/0125404 | A1 | * | 6/2007 | Davis et al. ................... 134/33 |
| 2009/0149702 | A1 | * | 6/2009 | Onoda et al. ................. 600/102 |

FOREIGN PATENT DOCUMENTS

WO 02/17355 A3 2/2002

* cited by examiner

*Primary Examiner* — Michael Barr
*Assistant Examiner* — Spencer Bell
(74) *Attorney, Agent, or Firm* — Patent Law Group LLP

(57) ABSTRACT

A wafer container cleaning device for cleaning container bodies and container covers of wafer containers includes a housing having a cleaning chamber defined therein, a rotor rotatably installed within the cleaning chamber of the housing, a plurality of container holders mounted to the rotor to removably hold the container bodies and the container covers, and a cleaning solution sprayer nozzle for spraying a cleaning solution toward the container bodies and the container covers held by the container holders. Each of the container holders includes a support tray having a body support portion for supporting each of the container bodies in an upside down state and a cover support portion for supporting each of the container covers.

17 Claims, 15 Drawing Sheets

WAFER CONTAINER CLEANING DEVICE

FIELD OF THE INVENTION

The present invention relates to a wafer container cleaning device and, more particularly, to a wafer container cleaning device capable of cleaning a wafer container in a speedy, easy and efficient manner.

BACKGROUND OF THE INVENTION

Wafers used in manufacturing semiconductor devices are highly accurate products. Therefore, care should be taken to protect the wafers from contaminants or shocks during storage or transportation thereof. In general, wafers are put into a container (called "front opening unified pod" or "FOUP") when they are stored or transported.

Referring to FIG. 1, a conventional container for storage and transportation of wafers (hereinafter referred to as "wafer container") includes a container body 1 and a container cover 3. The container body 1 is provided with a storage room 1a for storing a plurality of wafers W in a spaced-apart relationship. The container cover 3 closes and seals the opening 1b of the storage room 1a, thereby preventing foreign materials from entering the storage room 1a. This protects the wafers W stored within the storage room 1a.

The wafer container stores highly accurate wafers and therefore needs to be kept at a high degree of cleanness. In order to keep the wafer container at a high degree of cleanness, it is necessary to periodically clean the wafer container. The cleaning operation of the wafer container is conducted by a cleaning device.

One example of wafer container cleaning devices is disclosed in U.S. Pat. No. 6,797,076. This cleaning device includes an enclosure, a rotor rotatably installed within the enclosure, a plurality of container holders arranged around the rotor to support wafer containers and a sprayer nozzle for spraying a cleaning solution to the wafer container supported on the container holders.

In operation, the wafer containers to be cleaned are held on the container holders, after which the cleaning device is turned on. Then, the cleaning device cleans the inner and outer surfaces of the wafer containers while spraying the cleaning solution from the sprayer nozzle. At this time, the rotor carrying the wafer containers makes rotation so that the cleaning solution can be uniformly sprayed on the inner and outer surfaces of the wafer containers rotating together with the rotor. This increases the cleaning efficiency of the wafer containers.

However, the conventional cleaning device has a drawback in that it is quite inconvenient to attach the wafer containers to the container holders. This prolongs the time required in cleaning the wafer containers and consequently reduces the cleaning efficiency of the wafer containers.

More specifically, when the wafer containers are attached to the container holders in the conventional cleaning device, there is a need to perform a cumbersome task of bringing the upper end portions of the wafer containers into engagement with the upper hooks of the container holders and then having the lower end portions of the wafer containers engaged with the lower hooks of the container holders one by one.

This requires a lot of time in attaching the wafer containers to the container holders and prolongs the cleaning time of the wafer containers. The prolonged cleaning time results in sharp reduction in the cleaning efficiency of the wafer containers.

In addition, the conventional cleaning device has a structure capable of cleaning only the container body but not the container cover. This further prolongs the cleaning time of the wafer containers. The prolonged cleaning time results in sharp reduction in the cleaning efficiency of the wafer containers.

Moreover, the conventional cleaning device is incapable of simultaneously cleaning the interior and exterior of the container body. Thus, there is a need to first clean the exterior of the container body and then clean the interior thereof. This further prolongs the cleaning time of the wafer containers.

SUMMARY OF THE INVENTION

In view of the above-noted problems, it is an object of the present invention to provide a wafer container cleaning device capable of cleaning a wafer container in a speedy and efficient manner.

Another object of the present invention is to provide a wafer container cleaning device capable of shortening the cleaning time of a wafer container and greatly increasing the cleaning efficiency thereof.

A further object of the present invention is to provide a wafer container cleaning device capable of simultaneously cleaning a container body and a container cover.

A sill further object of the present invention is to provide a wafer container cleaning device capable of simultaneously cleaning the interior and exterior of a container body.

A yet still further object of the present invention is to provide a wafer container cleaning device capable of holding a container body and a container cover at the same place and cleaning them in an easier manner.

In accordance with the present invention, there is provided a wafer container cleaning device for cleaning container bodies and container covers of wafer containers, comprising: a housing having a cleaning chamber defined therein; a rotor rotatably installed within the cleaning chamber of the housing; a plurality of container holders mounted to the rotor to removably hold the container bodies and the container covers; and a cleaning solution sprayer nozzle for spraying a cleaning solution toward the container bodies and the container covers held by the container holders, wherein each of the container holders includes a support tray having a body support portion for supporting each of the container bodies in an upside down state and a cover support portion for supporting each of the container covers, the support tray being swingably mounted to the rotor for making a swinging movement between a preparation position in which each of the container bodies and each of the container covers can be placed on or removed from the support tray and a cleaning position in which each of the container bodies and each of the container covers are subjected to a cleaning operation.

BRIEF DESCRIPTION OF THE DRAWINGS

The above and other objects and features of the present invention will become apparent from the following description of preferred embodiments, given in conjunction with the accompanying drawings.

DETAILED DESCRIPTION OF THE PREFERRED EMBODIMENTS

One preferred embodiment of a wafer container cleaning device in accordance with the present invention will now be described in detail with reference to the accompanying drawings.

Figure 1:
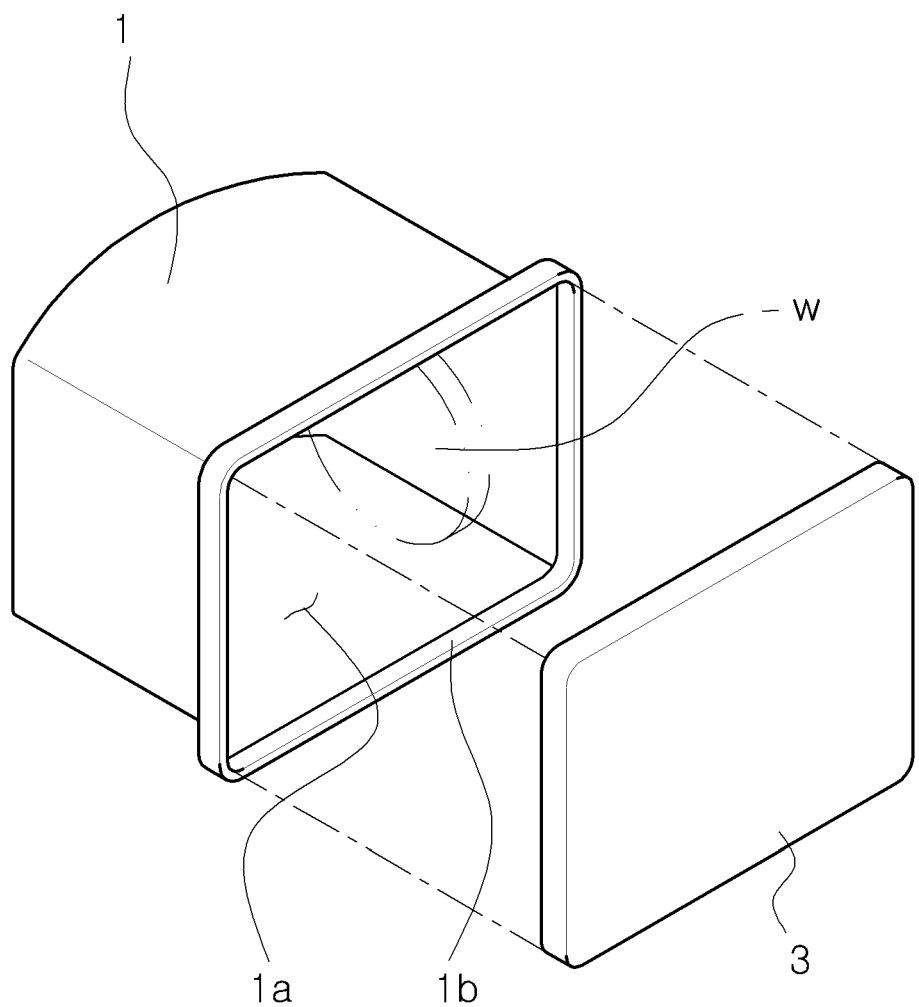
FIG. 1 is a perspective view showing a typical wafer container.
Figure 2:
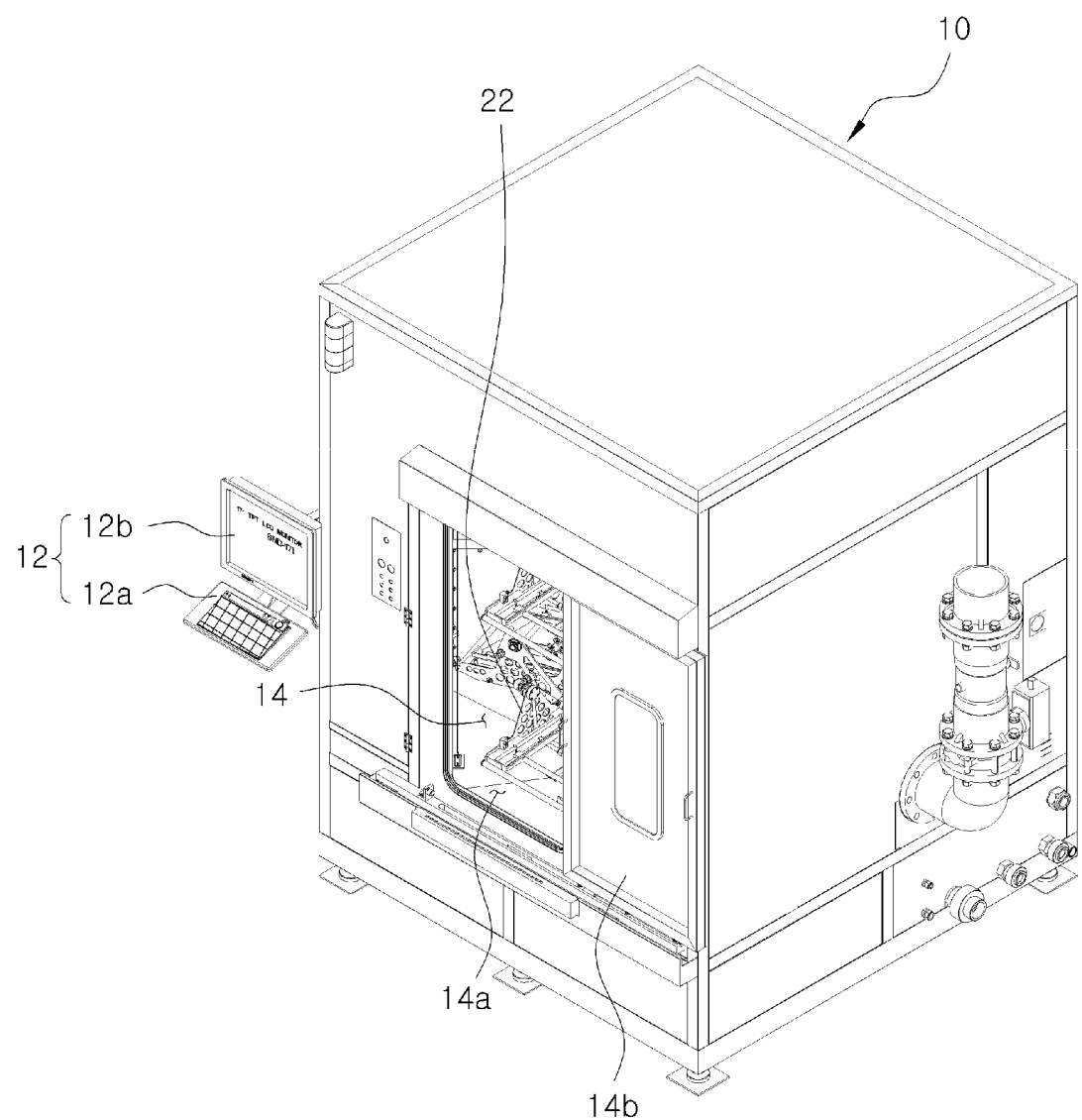
FIG. 2 is a perspective view showing the outward appearance of a wafer container cleaning device according to the present invention.
Figure 3:
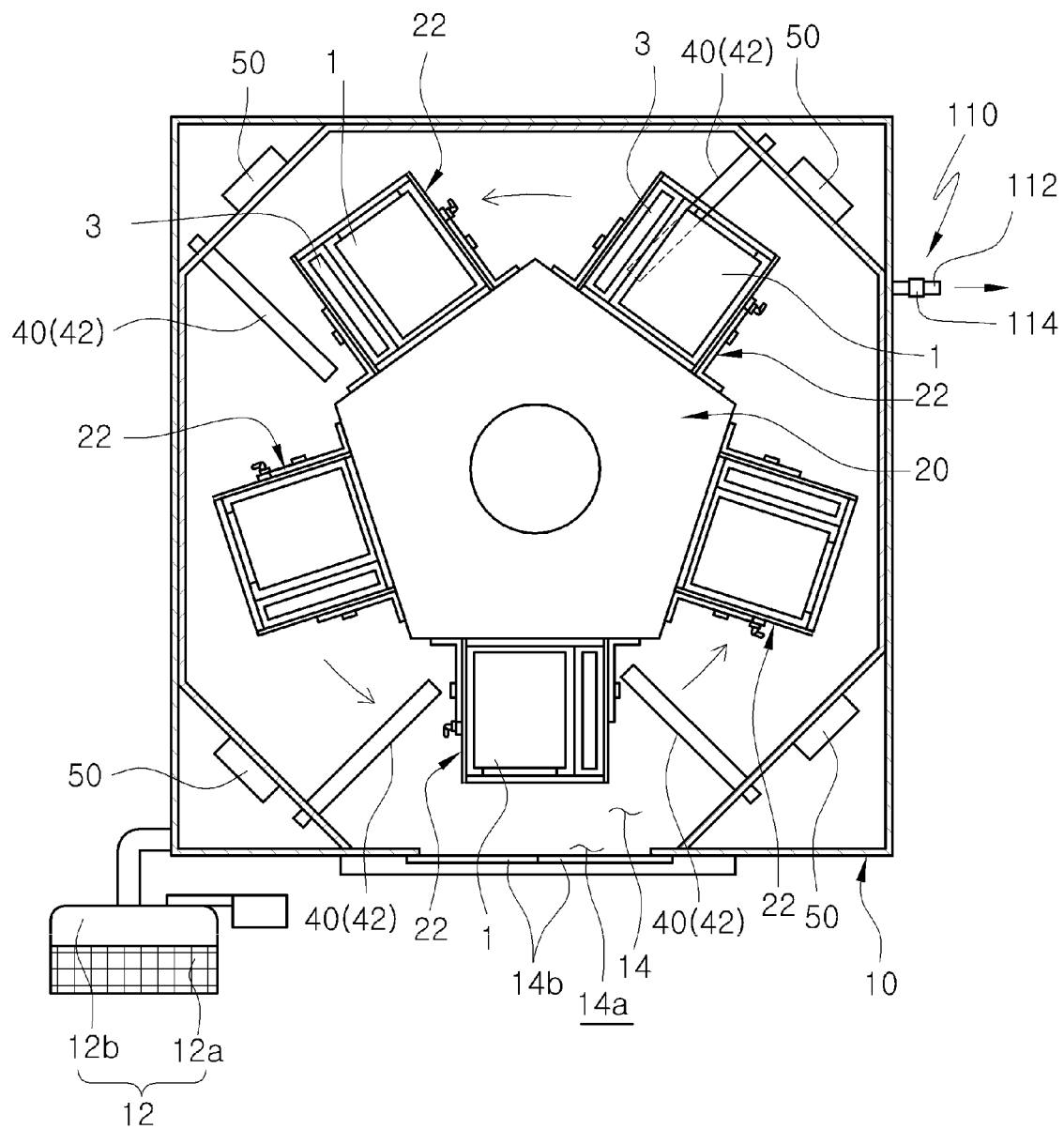
FIG. 3 is a horizontal section view showing the wafer container cleaning device according to the present invention.
Figure 4:
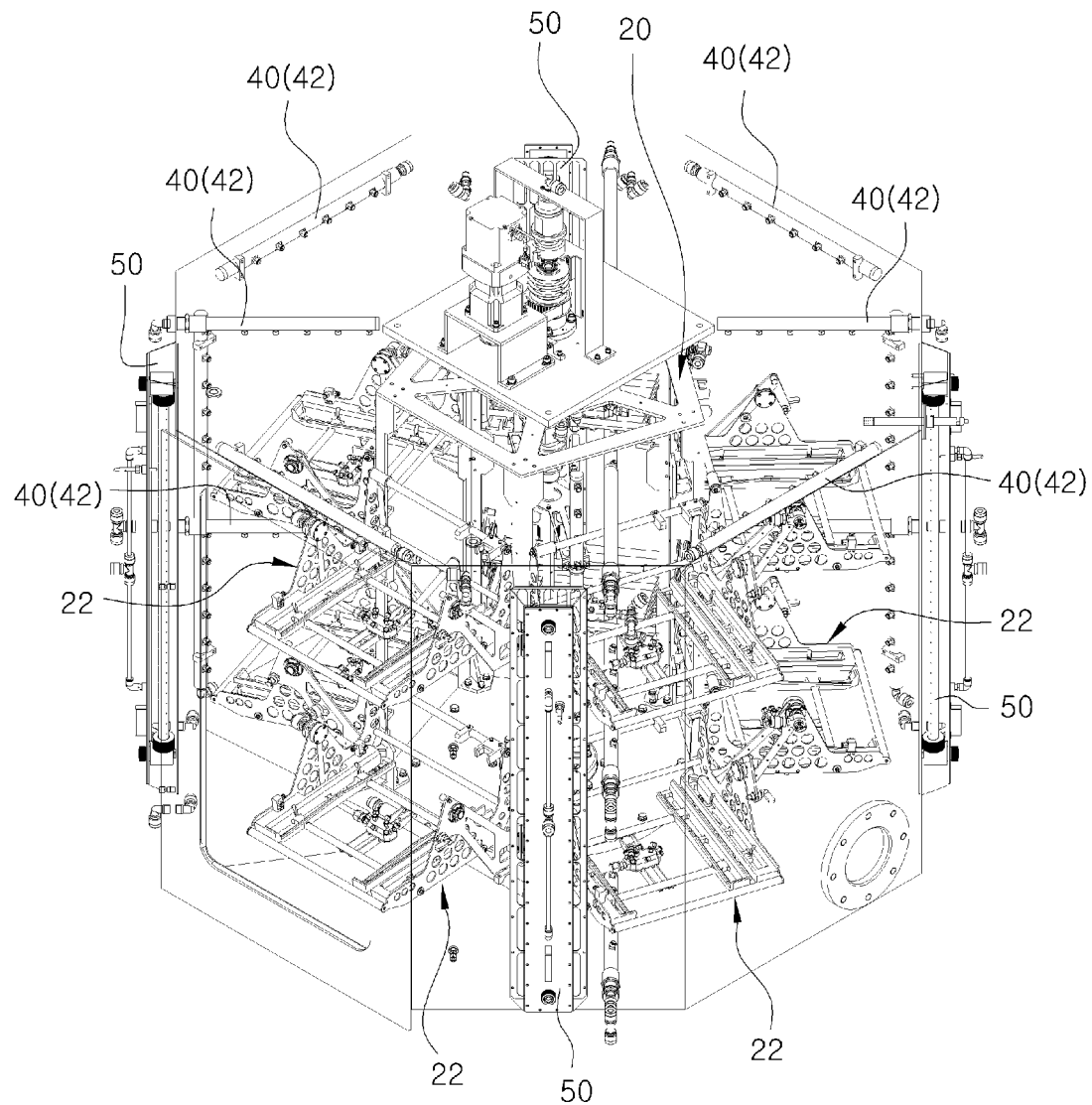
FIG. 4 is a perspective view showing a rotor and a plurality of container holders employed in the container cleaning device according to the present invention, with the container bodies and the container covers of wafer containers not attached to the container holders.

Referring first to FIGS. 2 and 3, the wafer container cleaning device of the present invention includes a housing 10 and a controller 12 installed at one side of the housing 10.

The controller 12 is designed to control the wafer container cleaning device and includes a control board (not shown), a plurality of operation buttons 12a and a monitor 12b.

The housing 10 includes a cleaning chamber 14 as a space for accommodating and cleaning wafer containers. The housing 10 is provided with a gateway 14a openably closed by a door 14b. The wafer containers to be cleaned are put into the cleaning chamber 14 through the gateway 14a, or the cleaned wafer containers are taken out from the cleaning chamber 14.

Figure 5:
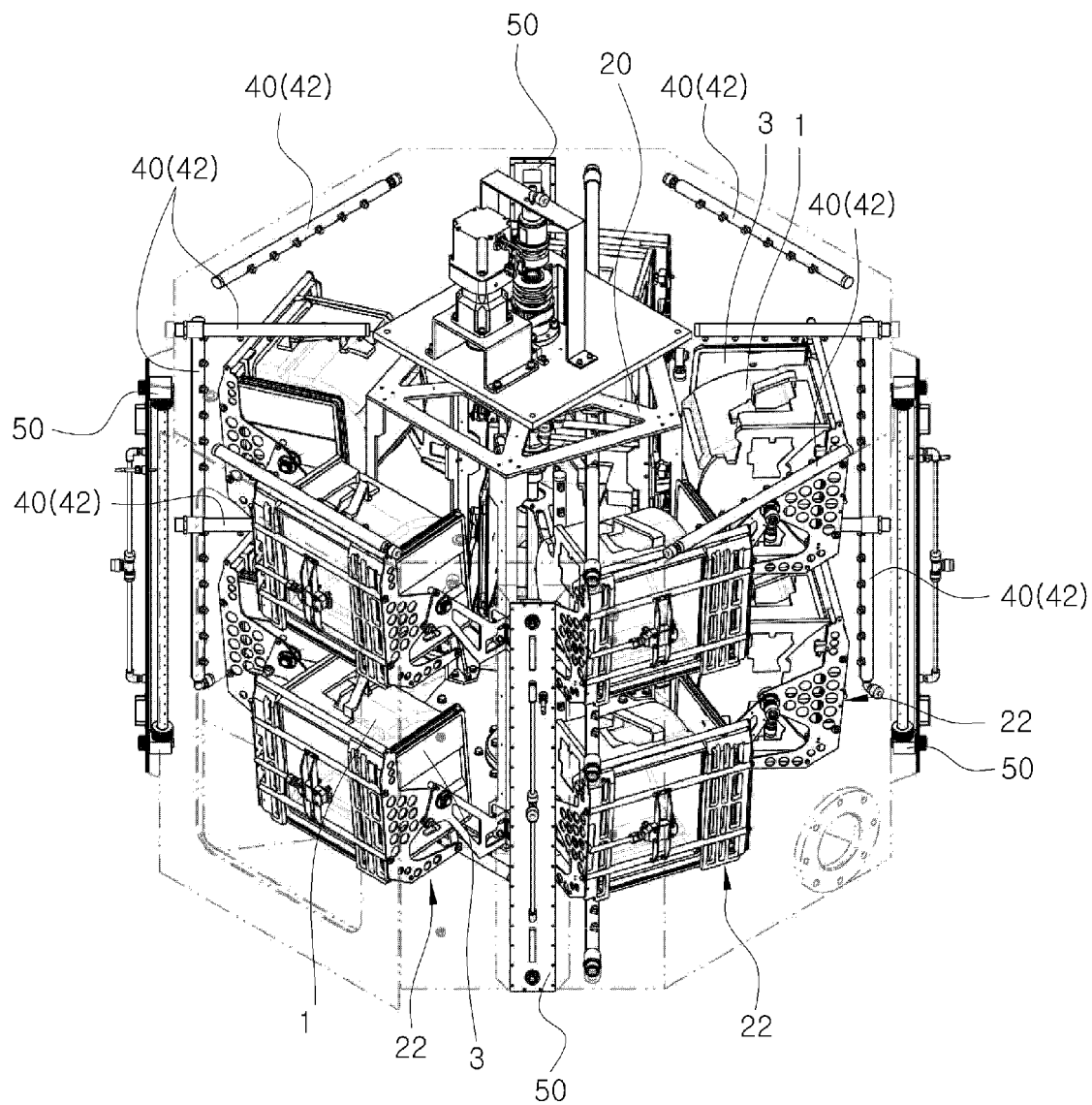
FIG. 5 is a perspective view showing the rotor and the container holders of the container cleaning device, with the container bodies and the container covers attached to the container holders.

The wafer container cleaning device further includes a rotor 20 provided within the cleaning chamber 14. As shown in FIGS. 3 and 5, the rotor 20 is rotatable about a vertical axis. A plurality of container holders 22 for holding the container bodies 1 and the container covers 3 of the wafer containers is installed around the rotor 20.

Prior to starting a cleaning operation, the rotor 20 is rotated stepwise about the vertical axis to bring the container holders 22 into alignment with the gateway 14a of the cleaning chamber 14 one by one. Then, each of the container bodies 1 and each of the container covers 3 are put into the cleaning chamber 14 and placed on each of the container holders 22.

During the cleaning operation, the rotor 20 is continuously rotated about the vertical axis together with the container holders 22 so that the cleaning solution sprayed from the below-mentioned cleaning solution sprayer nozzles 40 can be uniformly applied to the container bodies 1 and the container covers 3. This helps increase the cleaning efficiency of the container bodies 1 and the container covers 3.

Figure 6:
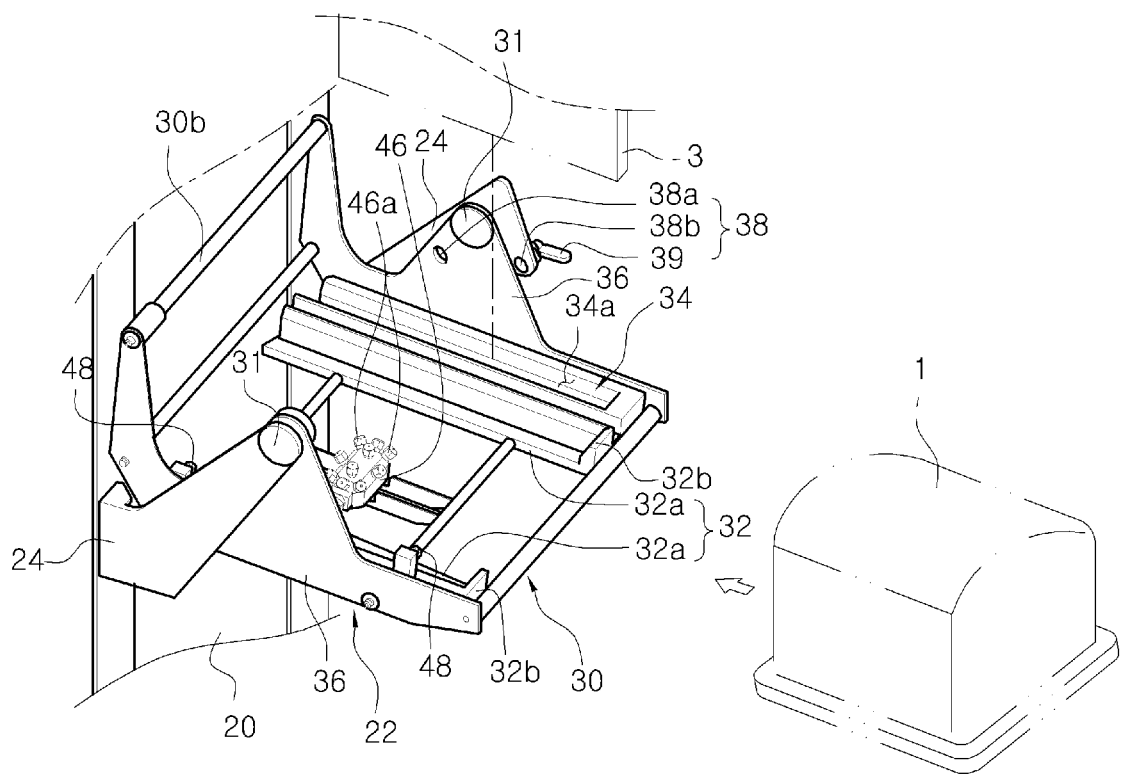
FIG. 6 is an enlarged perspective view showing one of the container holders of the wafer container cleaning device according to the present invention.
Figure 7:
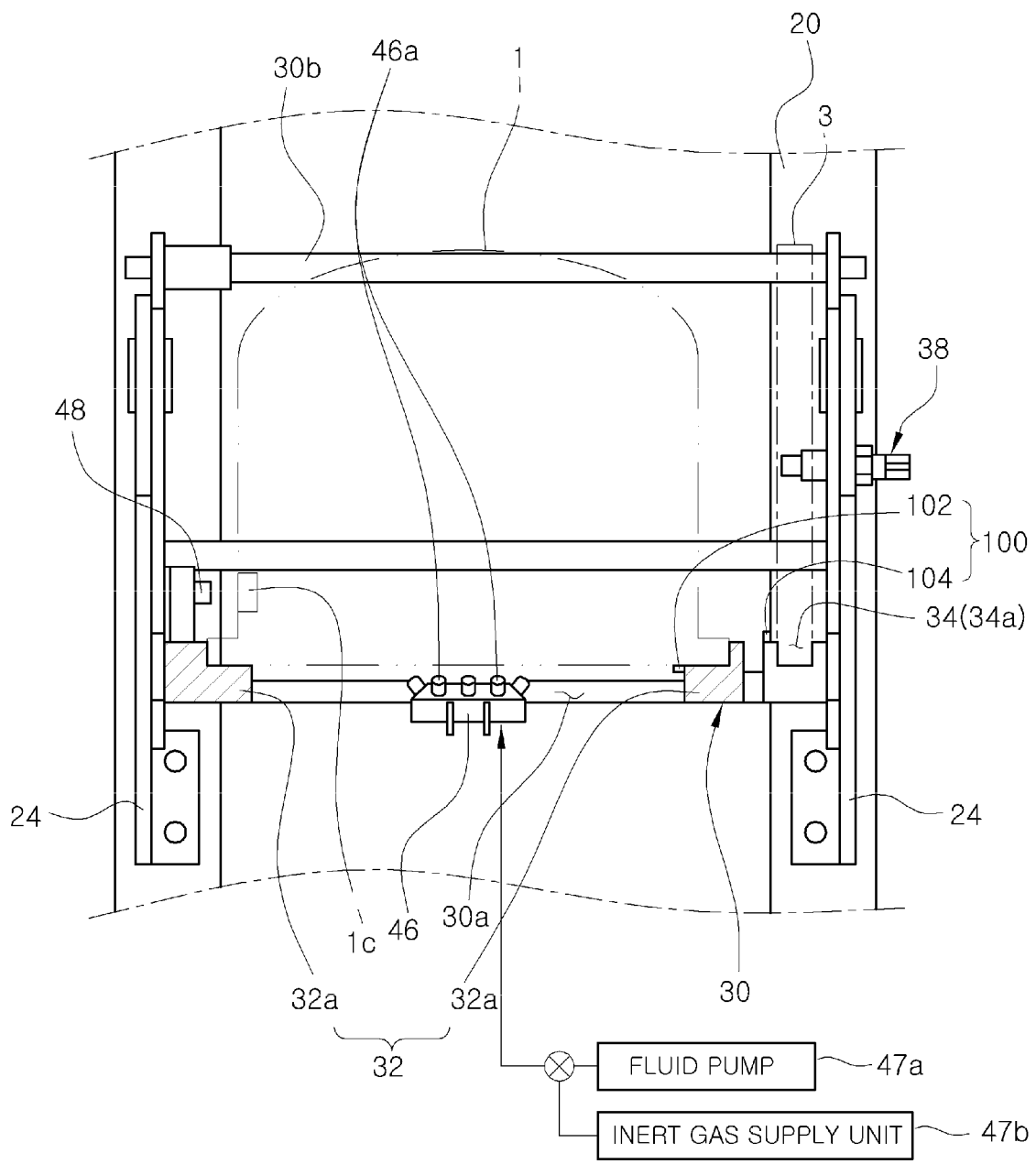
FIG. 7 is a front section view of one of the container holders shown in FIG. 6.
Figure 8:
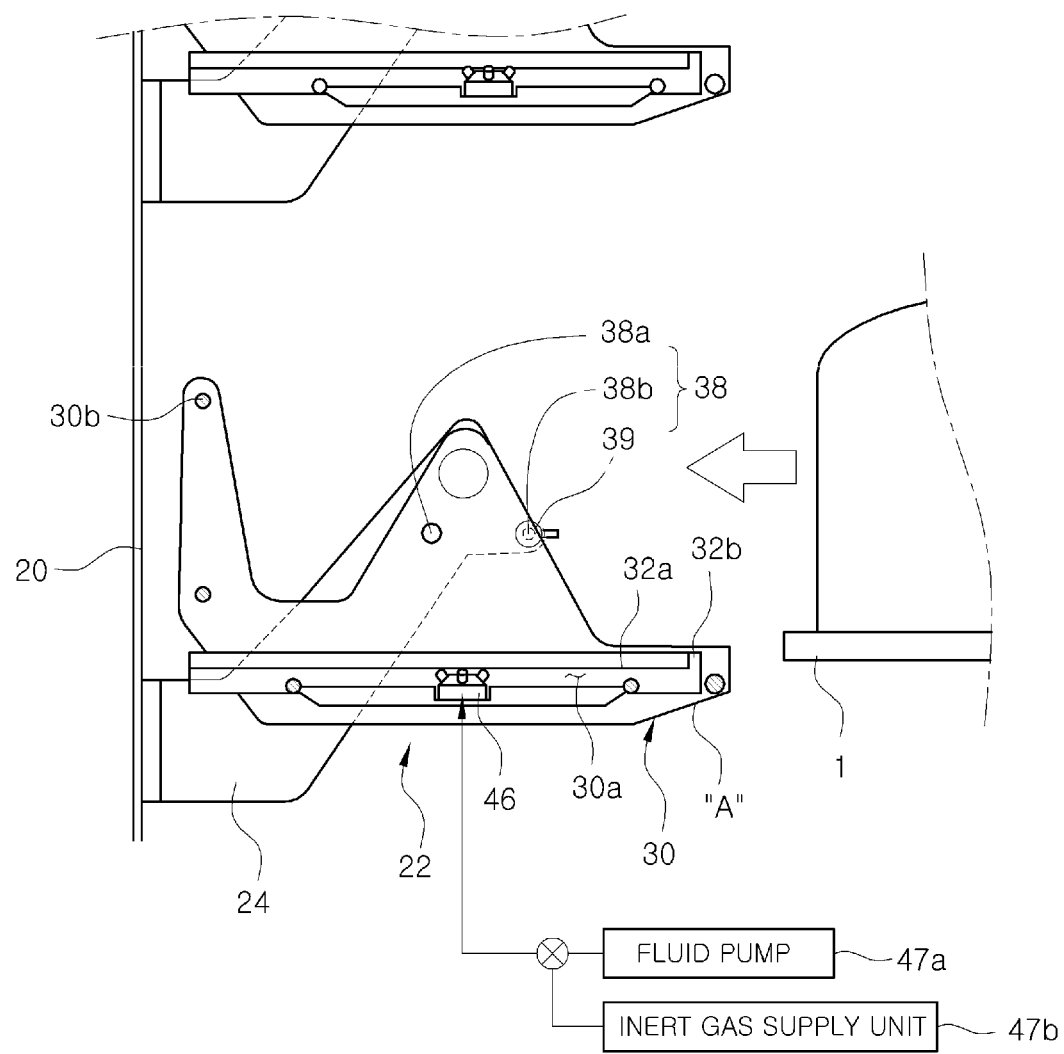
FIG. 8 is a side section view of one of the container holders shown in FIG. 6, with the container body and the container cover of the wafer container not attached to the container holder.
Figure 9:
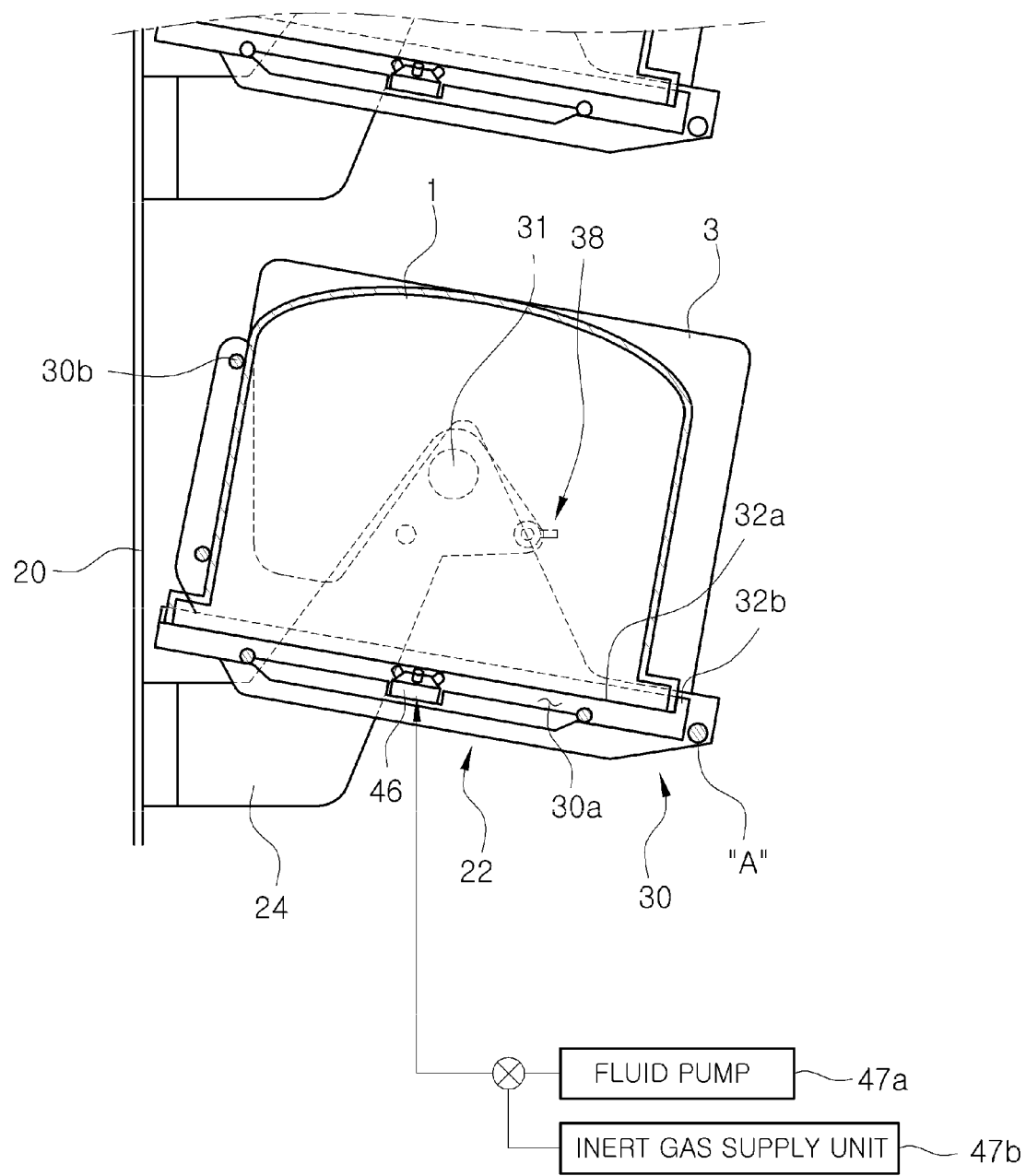
FIG. 9 is a side section view of one of the container holders shown in FIG. 6, with the container body and the container cover of the wafer container attached to the container holder.

After finishing the cleaning operation, the container bodies 1 and the container covers 3 are removed from the respective container holders 22 one by one. Referring to FIGS. 6 through 8, each of the container holders 22 includes a pair of support arms 24 fixedly secured to the rotor 20 and spaced apart from each other. A support tray 30 is rotatably installed between the support arms 24. The support tray 30 includes an at least partially opened bottom portion 30a, a body support portion 32 for supporting each of the container bodies 1 and a cover support portion 34 for supporting each of the container covers 3.

The body support portion 32 includes a pair of support rails 32a installed on the bottom portion 30a of the support tray 30. The support rails 32a are arranged in a spaced-apart relationship so that each of the container bodies 1 can be placed on the support rails 32a in an upside-down state. Thus, the frontal edges of each of the container bodies 1 are supported by the support rails 32a as each of the container bodies 1 is slidingly moved onto the support rails 32a from the front side.

Upwardly-protruding stoppers 32b are formed in the frontal end portions of the support rails 32a. The stoppers 32b are arranged in front of each of the container bodies 1 placed on the support rails 32a, thereby preventing each of the container bodies 1 from being inadvertently removed from the support tray 30 during the cleaning operation.

Since the bottom portion 30a of the support tray 30 is opened downwards between the support rails 32a, the interior of each of the container bodies 1 placed on the support rails 32a in an upside-down state is exposed downwards through the bottom portion 30a.

The cover support portion 34 includes a support groove 34a formed on the floor surface of the support tray 30. The support groove 34a extends parallel to one of the support rails 32a. One edge portion of each of the container covers 3 can be inserted into the support groove 34a and can be vertically supported by the cover support portion 34.

As can be seen in FIGS. 6 through 10, the support tray includes a pair of mutually spaced-apart side plates 36. The side plates 36 are rotatably attached to the support arms 24.

Figure 10:
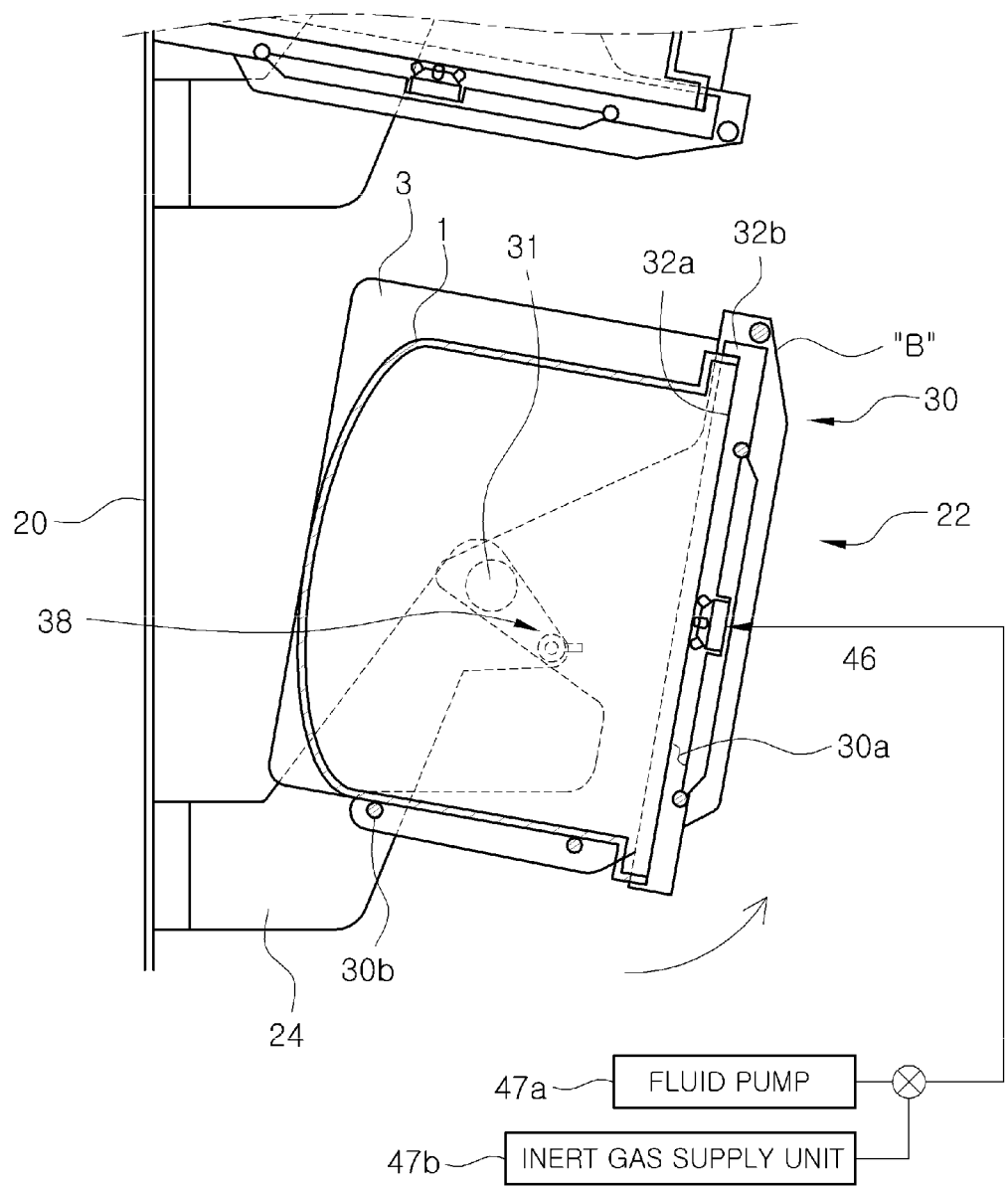
FIG. 10 is a side section view of one of the container holders shown in FIG. 6, in which view the container holder holding the container body and the container cover is swung upwards.

The side plates 36 serve to support the support tray 30 in such a manner that the support tray 30 can be swung from a horizontal preparation position "A" in which the bottom portion 30a faces downwards as shown in FIG. 8 to a vertical cleaning position "B" in which the bottom portion 30a faces radially outwards as shown in FIG. 10.

This makes it possible to generally vertically erect each of the container bodies 1 placed on the support tray 30 in an upside-down state, so that the entrance of each of the container bodies 1 can face radially outwards. One of the reasons for causing the entrance of each of the container bodies 1 to face radially outwards is to enhance the cleaning and drying efficiency of the container bodies 1. Another reason is to ensure that the centrifugal force generated during rotation of the rotor 20 can act on the cleaning solution sprayed into each of the container bodies 1, thereby efficiently discharging the cleaning solution.

It is preferred that, when in the preparation position "A", the support tray 30 makes an angle of from −10° to 0° with respect to the ground surface. In other words, each of the container bodies 1 is preferably kept at an angle of from −10° to 0° with respect to the ground surface when the support tray 30 is in the preparation position "A".

More preferably, the support tray 30 is configured to make an angle of about −10° with respect to the ground surface in the preparation position "A" so that each of the container bodies 1 can be a little inclined downwards. This is to make sure that the cleaning solution remaining within the container bodies 1 can be naturally drained at the end of the cleaning operation.

In the cleaning position "B", it is preferred that the support tray 30 is kept within 90° with respect to the preparation position "A". In other words, it is preferred that each of the container bodies 1 makes an angle of 90° or less with respect to the ground surface when the support tray 30 is in the cleaning position "B".

More preferably, the support tray 30 is configured to make an angle of about 80° with respect to the ground surface in the cleaning position "B". Thus, as shown in FIG. 10, each of the container bodies 1 makes an angle of about 80° with respect to the ground surface when the support tray 30 is in the cleaning position "B". As a result, each of the container bodies 1 is a little inclined downwards. This makes sure that the cleaning solution remaining within the container bodies 1 can be naturally drained at the end of the cleaning operation.

It is also preferred that the gravity center of each of the container bodies 1 coincides with the rotation axis of the support tray 30 when each of the container bodies 1 is placed on the support tray 30. This is to assure smooth rotation of the support tray 30.

Referring again to FIGS. 6 through 10, a locking unit 38 for fixing the support tray 30 in the cleaning position "B" is provided in one of the support arms 24.

As best shown in FIGS. 6, 8, 10 and 11, the locking unit 38 includes a locking hole 38a defined in one of the side plates 36 of the support tray 30, a locking pin 38b installed in one of the support arms 24 for engagement with the locking hole 38a and an index plunger 39 operated by a user to bring the locking pin 38b into engagement with or out of engagement from the locking hole 38a.

As can be seen in FIG. 10, the locking pin 38b is inserted into the locking hole 38a when the support tray 30 is swung into the cleaning position "B", thereby locking the support tray 30 in place. As a consequence, each of the container bodies 1 placed on the support tray 30 faces radially outwards and stays generally vertical.

Figure 11:
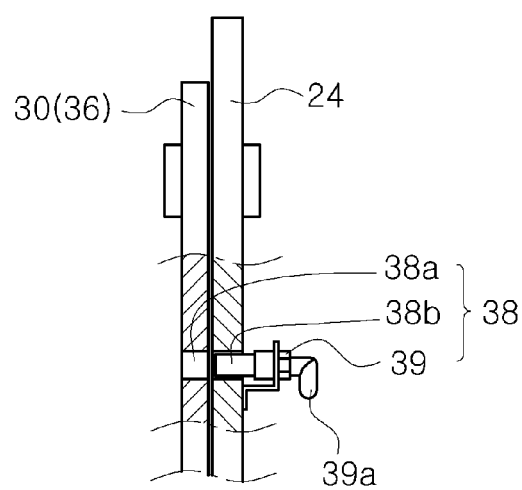
FIG. 11 is a section view showing a locking unit for locking the container holder.

As illustrated in FIG. 11, the index plunger 39 is of a lever type and is configured to normally bias the locking pin 38b into engagement with the locking hole 38a. Therefore, if the support tray 30 is swung into the cleaning position "B", the locking pin 38b is automatically inserted into and engaged with the locking hole 38a.

If a user turns the operation lever 39a of the index plunger 39, the locking pin 38b is moved out of engagement from the locking hole 38a. Consequently, the locking pin 38b is unlocked from the locking hole 38a. Thus, the user can release the support tray 30 locked in the cleaning position "B" so that the support tray 30 can be returned to the preparation position "A". The index plunger 39 is well-known in the art and therefore will be omitted from detailed description.

Turning back to FIGS. 6 through 10, a support bar 30b is arranged at the rear side of the support tray 30. The support bar 30b extends between the rear ends of the side plates 36 to support the rear surfaces of each of the container bodies 1 and each of the container covers 3 placed on the support tray 30. In case where the support tray 30 is swung into the cleaning position "B" as shown in FIG. 10, the support bar 30b supports the lower portions of each of the container bodies 1 and each of the container covers 3, thereby keeping them in a stable state.

Referring to FIGS. 3 through 6 and 12, the wafer container cleaning device further includes a plurality of cleaning solution sprayer nozzles 40 for spraying a cleaning solution toward the container bodies 1 and the container covers 3 held by the container holders 22.

The cleaning solution sprayer nozzles 40 includes a plurality of external nozzles 42 (see FIG. 12) arranged around the rotor 20, a plurality of internal nozzles 44 (see FIG. 12) arranged inside the rotor 20 and a plurality of tray nozzles 46 (see FIG. 6) arranged below the bottom portions 30a of the support trays 30.

As shown in FIGS. 3 through 5 and 12, the external nozzles 42 are installed around the rotor 20 to spray a cleaning solution toward the container bodies 1 and the container covers 3 held by the container holders 22, thereby cleaning the external surfaces of the container bodies 1 and the container covers 3.

Figure 12:
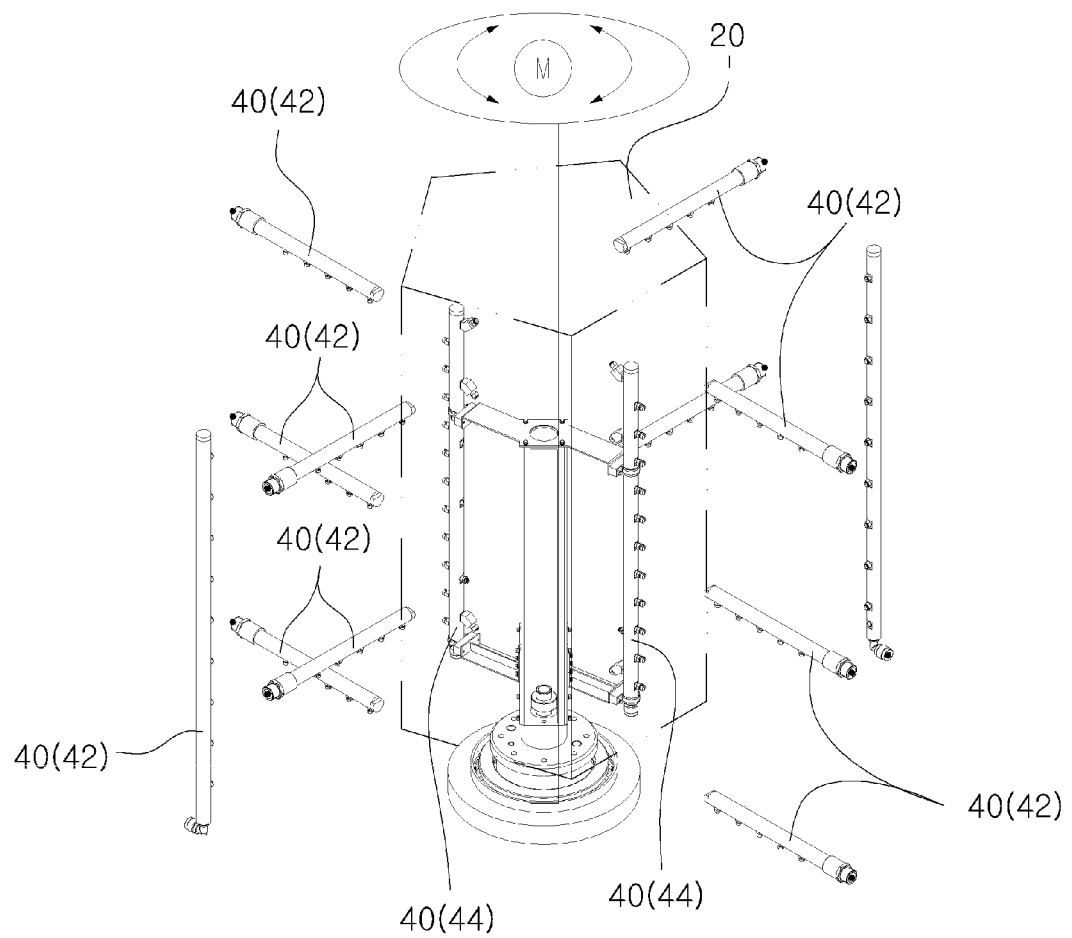
FIG. 12 is a view schematically showing the arrangement of cleaning solution sprayer nozzles employed in the container cleaning device according to the present invention.

As best shown in FIG. 12, the internal nozzles 44 are integrally installed with the rotor 20 so that they can rotate together with the rotor 20. While rotating together with the rotor 20, the internal nozzles 44 spray a cleaning solution toward the container bodies 1 and the container covers 3 held by the container holders 22, thereby cleaning the external surfaces of the container bodies 1 and the container covers 3.

Each of the tray nozzles 46 has a polygonal shape and is installed near the bottom portion 30a of the support tray 30 as can be seen in FIGS. 6 through 10. Each of the tray nozzles 46 includes a plurality of nozzle holes 46a facing toward the interior of each of the container bodies 1 placed on the support rails 32a in an upside-down state. Each of the tray nozzles 46 is supplied with a cleaning solution from a fluid pump 47a to spray it toward the interior of each of the container bodies 1, eventually cleaning the interior of each of the container bodies 1 with increased efficiency.

It is preferred that each of the tray nozzles 46 is positioned lower than the support rails 32a as illustrated in FIGS. 7 through 10. This is to prevent each of the tray nozzles 46 from interfering with each of the container bodies 1 slidingly moved along the support rails 32a of the support tray 30.

The nozzle holes 46a of each of the tray nozzles 46 are arranged in a radial pattern to face the interior of each of the container bodies 1. This makes it possible for each of the tray nozzles 46 to uniformly spray the cleaning solution into each of the container bodies 1. The number of the nozzle holes 46a is preferably about 6 to 12.

If necessary, the tray nozzles 46 may spray an inert gas. To this end, the tray nozzles 46 are connected to an inert gas supply unit 47b such as an inert gas tank. The inert gas is sprayed through the tray nozzles 46 during the course of drying the container bodies 1. This assists in increasing the drying efficiency of the container bodies 1. It is preferred that the inert gas is heated to a specified temperature by means of a heater (not shown). This is to remove the fine drops of the cleaning solution existing in the internal flow paths of the tray nozzles 46.

Referring again to FIGS. 6 and 7, the support tray 30 further includes an air spray nozzle 48 for spraying an air toward the filter portion 1c of each of the container bodies 1. The air spray nozzle 48 is installed in one of the support rails 32a of the support tray 30. The air spray nozzle 48 is positioned so that it can face the filter portion 1c of each of the container bodies 1 when the latter is placed on the support rails 32a. Thus, the air spray nozzle 48 can spray an air toward the filter portion 1c of each of the container bodies 1, thereby efficiently drying the filter portion 1c.

The air spray nozzle 48 is arranged to remain spaced apart from the external surface of each of the container bodies 1 when the latter is placed on the support rails 32a. This is to prevent the air spray nozzle 48 from interfering with each of the container bodies 1 slidingly moved along the support rails 32a of the support tray 30.

Figure 13:
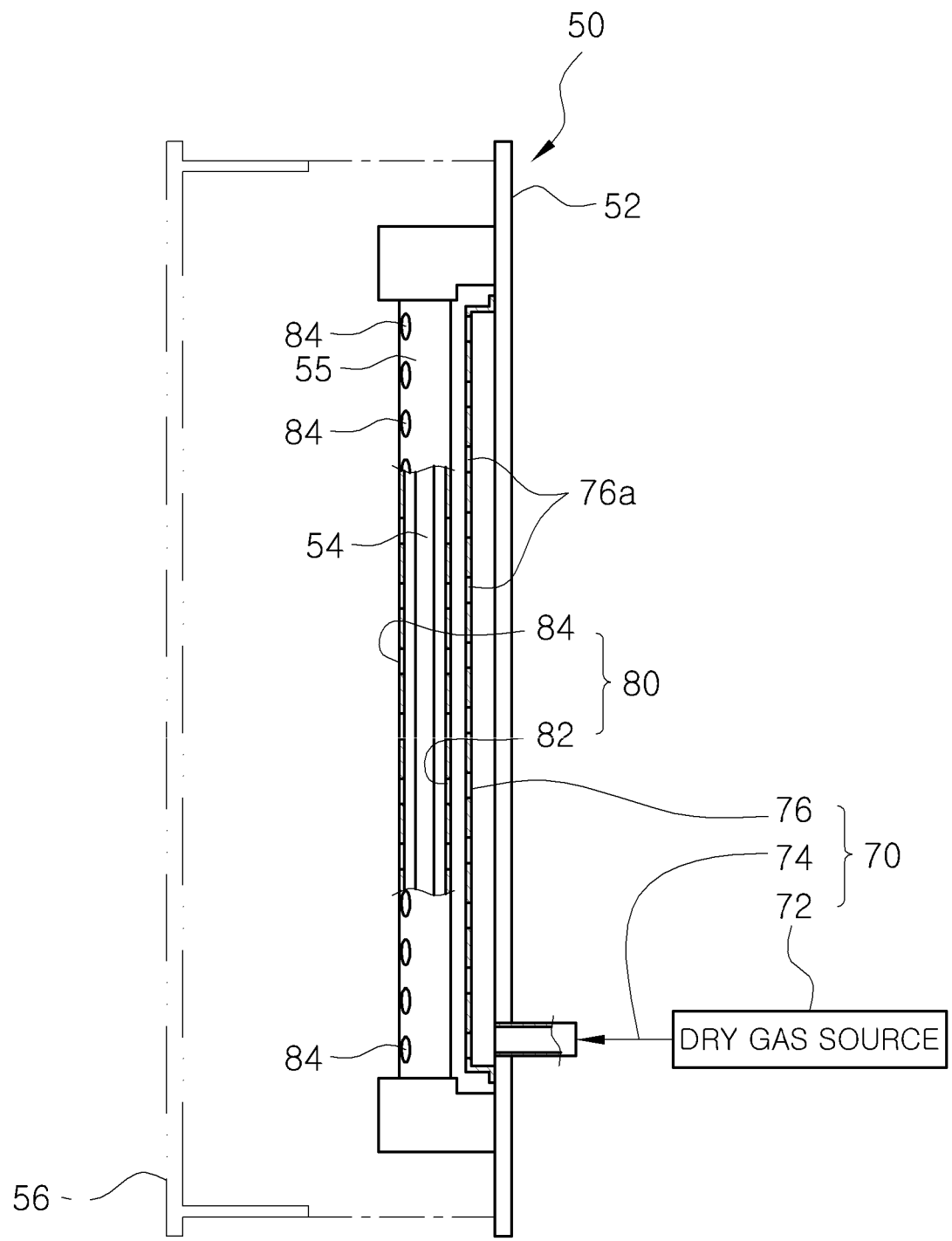
FIG. 13 is a section view showing a lamp unit and a dry gas sprayer unit employed in the container cleaning device according to the present invention.
Figure 14:
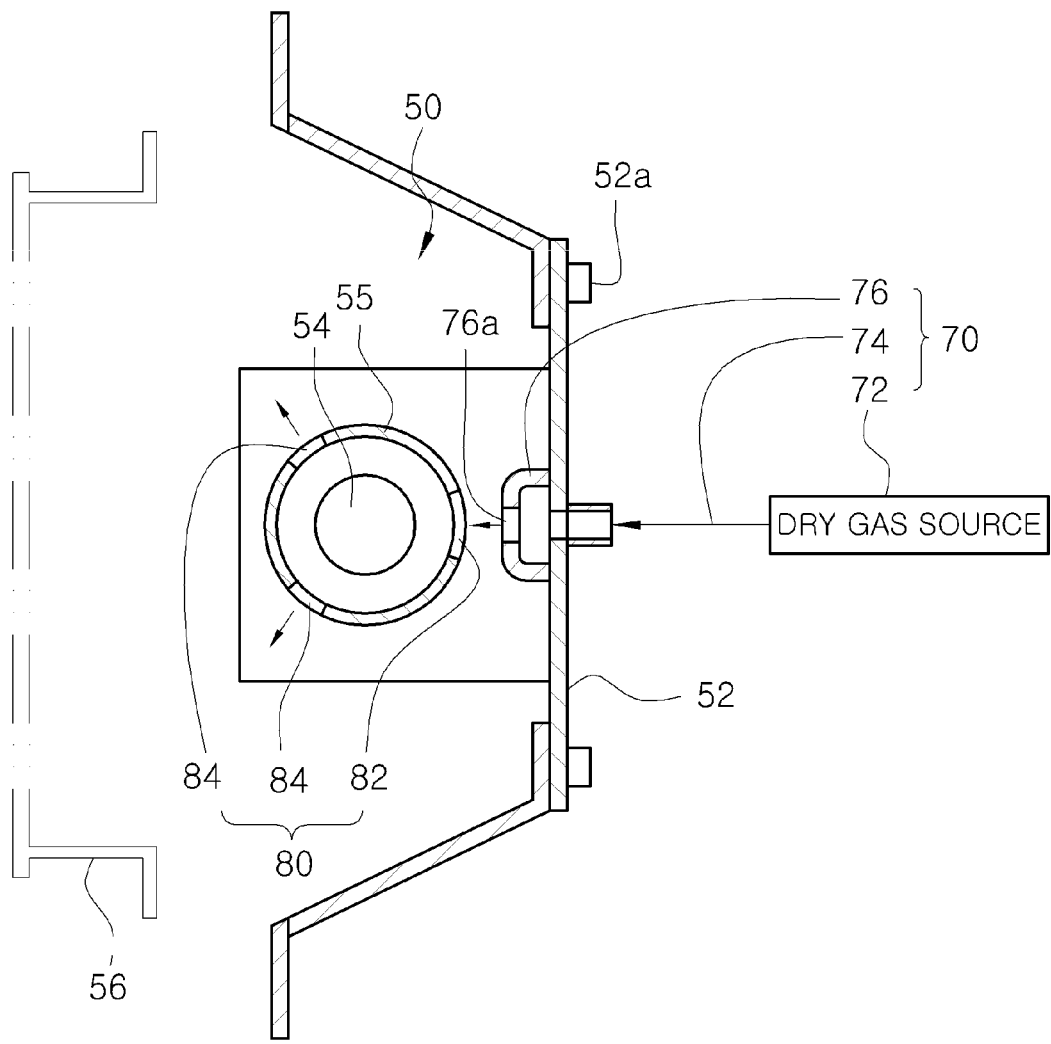
FIG. 14 is a horizontal section view of the lamp unit and the dry gas sprayer unit shown in FIG. 13.

Referring to FIGS. 3 through 5, 13 and 14, the wafer container cleaning device further includes a plurality of lamp units 50 provided around the rotor 20. The lamp units 50 are arranged at four corners of the cleaning chamber 14. As shown in FIGS. 13 and 14, each of the lamp units 50 includes a lamp base 52, a lamp 54 attached to the lamp base 52, a transparent tube 55 surrounding the lamp 54 and a lamp cover 56 covering and protecting the transparent tube 55.

The lamp 54 is formed of, e.g., a near infrared lamp, the opposite end portions of which are supported by the lamp base 52. The lamp 54 is energized by an electric current to irradiate infrared rays into the cleaning chamber 14. During the process of drying the container bodies 1 and the container covers 3, the lamp 54 serves to increase the temperature within the cleaning chamber 14 and the temperature of the gas used in drying the container bodies 1 and the container covers 3, consequently enhancing the drying efficiency of the container bodies 1 and the container covers 3.

The transparent tube 55 is arranged around the lamp 54 in a spaced-apart relationship to protect the lamp 54 from the cleaning solution splashed during the cleaning operation. Thus, the transparent tube 55 reduces damage of the lamp 54 caused by the cleaning solution, thereby prolonging the lifespan of the lamp 54.

As shown in FIG. 14, the lamp base 52 is fixed to the housing 10 by means of bolts 52a so that it can be removed from the housing 10 at the outside of the housing 10. In the event of failure or damage of the lamp units 50, the lamp base is detached from the housing 10 to repair or replace the lamp 54 mounted to the lamp base 52. This allows a user to perform the repair and replacement of the lamp 54 with ease.

Referring again to FIGS. 13 and 14, the wafer container cleaning device further includes a dry gas injector unit 70 for injecting a dry gas, e.g., an inert gas, into the cleaning chamber 14.

The dry gas injector unit 70 includes a dry gas source 72 for holding a dry gas, a feed line 74 through which to feed the dry gas from the dry gas source 72 to the cleaning chamber 14 and an injection nozzle 76 for injecting the dry gas into the cleaning chamber 14.

The injection nozzle 76 includes a plurality of injection holes 76a and is mounted to the lamp base 52 of each of the lamp units 50 to extend along the transparent tube 55. The injection nozzle 76 thus mounted injects the dry gas into the cleaning chamber 14.

The dry gas injector unit 70 further includes a heater 80 for heating the dry gas injected from the injection nozzle 76. The heater 80 includes a plurality of inlet holes 82 through which the dry gas injected from the injection nozzle 76 is introduced to between the lamp 54 and the transparent tube 55 of each of the lamp units 50 and a plurality of outlet holes 84 through which the dry gas introduced to between the lamp 54 and the transparent tube 55 is discharged into the cleaning chamber 14.

The inlet holes 82 are formed in the transparent tube 55 in a corresponding relationship with the injection holes 76a of the injection nozzle 76 so that dry gas injected from the injection nozzle 76 can be introduced to between the lamp 54 and the transparent tube 55 through the inlet holes 82. The dry gas thus introduced is heated to a high temperature by the lamp 54.

The outlet holes 84 are formed in the transparent tube 55 so that the dry gas of high temperature heated by the lamp 54 can be discharged into the cleaning chamber 14 through the outlet holes 84. The dry gas of high temperature thus discharged serves to increase the internal temperature of the cleaning chamber 14, thereby increasing the drying efficiency of the container bodies 1 and the container covers 3. In this regard, the outlet holes 84 are formed in two rows along the longitudinal direction of the transparent tube 55. The outlet holes 84 of one row make an angle of about 60 to 120° with respect to the outlet holes 84 of the other row.

The dry gas heated by the lamp 54 serves to deprive the lamp 54 of heat to cool the lamp 54, thereby preventing failure of the lamp 54 and prolonging the lifespan thereof. In addition, the dry gas discharged from the outlet holes 84 of the transparent tube 55 serves to prevent any moisture from reversely flowing into the outlet holes 84 from the cleaning chamber 14. This assists in preventing damage of the transparent tube 55 and the lamp 54 otherwise caused by the moisture.

Figure 15:
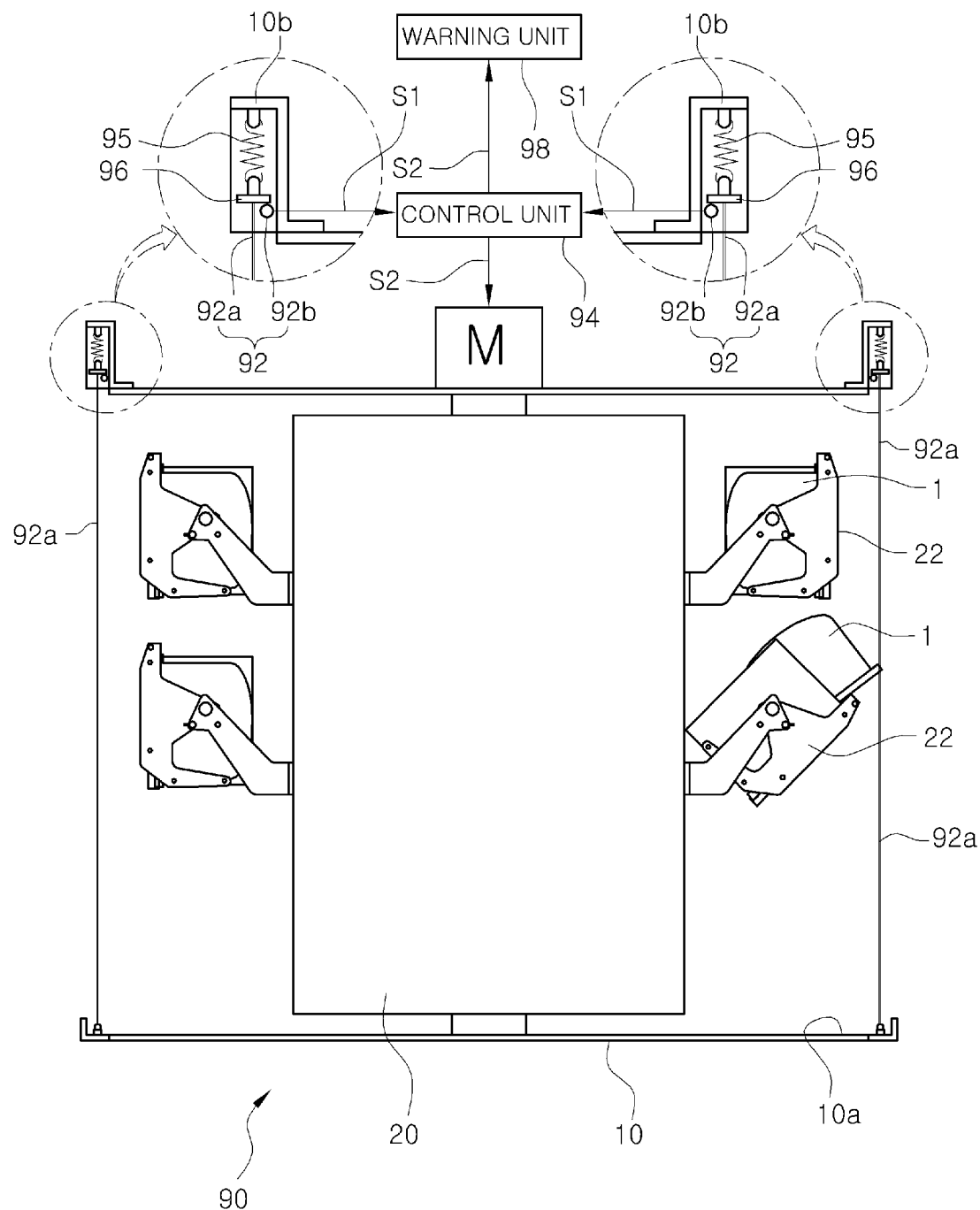
FIG. 15 is a view showing a safety unit employed in the container cleaning device according to the present invention.

Referring to FIG. 15, the wafer container cleaning device further includes a safety unit 90 for stopping the cleaning operation in the event that the container bodies 1 or the container covers 3 are separated from the container holders 22 during the cleaning operation.

The safety unit 90 includes a separation sensing unit 92 for sensing the separation of the container bodies 1 or the container covers 3 from the container holders 22 to generate a separation signal S1 and a control unit 94 for controlling the operation of the rotor 20 in response to the separation signal S1 inputted from the separation sensing unit 92.

The separation sensing unit 92 includes a tension wire 92a installed around the rotor 20 and a photo sensor 92b for sensing the deformation of the tension wire 92a. The tension wire 92a is supported at its lower end by the bottom surface 10a of the housing 10 and at its upper end by the top surface 10b of the housing 10. A spring 95 and a sensor plate 96 are arranged between the upper end of the tension wire 92a and the housing 10.

The spring 95 pulls the tension wire 92a to keep it strained. The spring 95 permits deformation of the tension wire 92a when an external force is applied to the tension wire 92a, namely when the container bodies 1 or the container covers 3 are separated from the container holders 22 and come into contact with the tension wire 92a. As the tension wire 92a undergoes deformation, the sensor plate 96 can move in the upper, lower, left and right directions. The photo sensor 92b is installed on the housing 10 and is designed to output a separation signal S1 upon sensing the movement of the sensor plate 96.

The control unit 94 includes a microprocessor and, if the separation signal S1 is inputted from the photo sensor 92b, makes a determination that the container bodies 1 or the container covers 3 are separated from the container holders 22. Then, the control unit 94 outputs a control signal S2 to have the rotor 20 stop its rotation, thereby stopping the cleaning operation of the container bodies 1 and the container covers 3.

The safety unit 90 further includes a warning unit 98 for warning an operator of the separation of the container bodies 1 or the container covers 3. The warning unit 98 is composed of a warning buzzer or a warning lamp operated by the control signal S2 issuing from the control unit 94. If necessary, the warning unit 98 may be provided with both the warning buzzer and the warning lamp. The warning unit 98 serves to rapidly advise an operator of the separation of the container bodies 1 or the container covers 3. This allows the operator to take an appropriate follow-up measure.

It is preferred that the separation sensing unit 92 of the safety unit 90 is installed in plural numbers around the rotor 20. This makes it possible to efficiently sense the separation of the container bodies 1 or the container covers 3.

Referring again to FIG. 7, the wafer container cleaning device includes a right position sensing unit 100 which in turn is composed of a body right position sensing unit 102 and a cover right position sensing unit 104.

The body right position sensing unit 102 is a sensor arranged in the vicinity of the body support portion 32 to sense each of the container bodies 1 and to generate a body sensing signal when each of the container bodies 1 is supported in a right position on the body support portion 32. The cover right position sensing unit 104 is a sensor arranged in the vicinity of the cover support portion 34 to sense each of the container covers 3 and to generate a cover sensing signal when each of the container covers 3 is supported in a right position on the cover support portion 34.

Upon receiving the sensing signal from the body right position sensing unit 102 or the cover right position sensing unit 104, the controller 12 (see FIGS. 2 and 3) performs the processing of the sensing signal to determine whether the container bodies 1 and the container covers 3 are accurately supported on the body support portion 32 and the cover support portion 34. If the result of determination shows that the container bodies 1 or the container covers 3 is not accurately supported in the right position, the controller 12 holds the rotor 20 against rotation to prevent occurrence of a safety accident.

Referring again to FIGS. 2 and 3, the wafer container cleaning device includes an evacuation unit 110 for evacuating the gas existing within the cleaning chamber 14.

The evacuation unit 110 includes an exhaust pipe 112 connected to the housing 10 and a shutoff valve 114 for opening and closing the exhaust pipe 112. By evacuating the cleaning chamber 14, the evacuation unit 110 helps the dry gas to be smoothly injected from the dry gas injector unit 70 (see FIGS. 13 and 14) into the cleaning chamber 14.

The operation of the shutoff valve 114 is controlled by the controller 12 in such a manner that the shutoff valve 114 is automatically opened and closed depending on the internal pressure of the cleaning chamber 14 to evacuate the gas from the cleaning chamber 14 in a controlled flow rate. The shutoff valve 114 may be manually operated so that an operator can evacuate the cleaning chamber 14 at his or her desire.

Next, the operation of the wafer container cleaning device configured as above will be described with reference to FIGS. 2 through 12.

First, the cleaning chamber 14 of the housing 10 is opened as shown in FIGS. 2 and 3. Then, the container bodies 1 and the container covers 3 are put into the cleaning chamber 14 through the gateway 14a so that they can be placed on the container holders 22.

At this time, as shown in FIG. 8, each of the container bodies 1 is slid along the support rails 32a of the support tray 30 with the entrance thereof faced downwards. Each of the container covers 3 is supported in the support groove 34a of the support tray 30 in an upright posture.

If the container bodies 1 and the container covers 3 are held in place, the support tray 30 holding each of the container bodies 1 and each of the container covers 3 is swung substantially 90° in the upward direction from the preparation position "A" to the cleaning position "B" as shown in FIG. 10.

As the support tray 30 takes a substantially upright posture, each of the container bodies 1 is also swung together with the support tray 30 so that the entrance thereof can face radially outwards. As a result, the container bodies 1 and the container covers 3 become ready for a cleaning operation.

As the support tray 30 is swung from the preparation position "A" to the cleaning position "B", the locking pin 38b is automatically inserted into the locking hole 38a of the support tray 30 to have the support tray 30 locked in the cleaning position "B". Thus, the container bodies 1 are ready for a cleaning operation in a stable posture.

If the cleaning operation is ready to perform, the door 14b is closed to hermetically seal the cleaning chamber 14 as shown in FIG. 2. Then, the controller 12 is operated to turn on the wafer container cleaning device. The cleaning operation of the container bodies 1 and the container covers 3 is started by spraying the cleaning solution through the cleaning solution sprayer nozzles 42, 44 and 46 as shown in FIGS. 3 and 5.

At this time, the rotor 20 is rotated so that the cleaning solution can be uniformly sprayed from the cleaning solution sprayer nozzles 42 and 44 on the surfaces of the container bodies 1 and the container covers 3. Thus, the container bodies 1 and the container covers 3 are cleaned with increased cleaning efficiency.

Once the cleaning operation of the container bodies 1 and the container covers 3 comes to an end, the cleaning solution is no longer sprayed from the cleaning solution sprayer nozzles 42 and 44. Instead, the lamp 54 is operated to dry the surfaces of the container bodies 1 and the container covers 3.

After the container bodies 1 and the container covers 3 are dried, the door 14b is opened to take out the container bodies 1 and the container covers 3 from the cleaning chamber 14 of the housing 10. The order of taking out the container bodies 1 and the container covers 3 is opposite to the order of placing the container bodies 1 and the container covers 3 on the container holders 22.

With the wafer container cleaning device of the present invention described above, the container bodies 1 can be fixed in place by merely placing the container bodies 1 on the container holders 22 in an upside down state and swinging the container holders 22 in the upward direction. Therefore, it is possible to easily and rapidly attach the container bodies to the container holders 22, eventually assuring easy and rapid cleaning of the wafer containers.

Furthermore, the container bodies 1 are slidingly attached to and detached from the container holders 22. This makes it possible to attach and detach the container bodies 1 in an easy and rapid manner, which assists in assuring easy and rapid cleaning of the wafer containers. This helps shorten the cleaning time of the wafer containers and enhance the cleaning efficiency of the wafer containers.

Since the container covers 3 of the wafer containers are simultaneously cleaned with the container bodies 1, there is no need to independently clean the container covers 3. This further enhances the cleaning efficiency of the wafer containers.

The wafer container cleaning device of the present invention is capable of simultaneously cleaning the inner surfaces and outer surfaces of the container bodies 1. This makes it possible to clean the wafer containers within a short period of time.

Inasmuch as each of the container bodies 1 and each of the container covers 3 mating therewith are placed on the same support tray 30, there is little possibility that the container bodies 1 or the container covers 3 in one pair are interchanged with the container bodies 1 or the container covers 3 in another pair.

While one preferred embodiment of the invention has been described hereinabove, the present invention is not limited thereto. It is to be understood that various changes and modifications may be made without departing from the scope of the invention defined in the claims.

What is claimed is:

1. A wafer container cleaning device for cleaning container bodies and container covers of wafer containers, comprising:
   a housing having a cleaning chamber defined therein;
   a rotor rotatably installed within the cleaning chamber of the housing;
   a plurality of container holders mounted to the rotor to removably hold the container bodies and the container covers;
   a cleaning solution sprayer nozzle for spraying a cleaning solution toward the container bodies and the container covers held by the container holders;
   a tray nozzle arranged below the support tray to spray a cleaning solution into each of the container bodies;
   an air spray nozzle provided in the support tray to spray an air toward each of the container bodies;
   wherein each of the container holders includes a support tray having a body support portion for supporting each of the container bodies in an upside down state and a cover support portion for supporting each of the container covers, the support tray being swingably mounted to the rotor for making a swinging movement between a preparation position in which each of the container bodies and each of the container covers can be placed on or removed from the support tray and a cleaning position in which each of the container bodies and each of the container covers are subjected to a cleaning operation;
   wherein the support tray stays substantially horizontal in the preparation position but is kept swung away from the rotor in the cleaning position, and further comprising a locking unit for locking the support tray against movement in the cleaning position;
   wherein the support tray is opened radially outwards in the preparation position to allow each of the container bodies to slidingly move along the support tray when attaching or removing each of the container bodies;
   wherein the body support portion includes a pair of spaced-apart support rails arranged to support the frontal edges of each of the container bodies, and the cover support portion includes a support groove defined on the support tray to hold one edge of each of the container covers;
   wherein the support tray includes a support bar arranged to support each of the container bodies and each of the container covers when the support tray is in the cleaning position;
   wherein the support tray includes an open bottom portion arranged between the support rails;
   wherein the tray nozzle is installed in a position where the tray nozzle does not interfere with each of the container bodies;
   wherein the tray nozzle is designed to inject a dry gas when the cleaning operation comes to an end; and
   wherein the air spray nozzle is installed in a position where the air spray nozzle does not interfere with each of the container bodies.

2. The device as recited in claim 1, wherein the support tray makes an angle of from −10° to 0° with respect to a ground surface when the support tray is in the preparation position.

3. The device as recited in claim 1, wherein the support tray makes an angle of 90° or less with respect to the preparation position when the support tray is in the cleaning position.

4. The device as recited in claim 2, wherein the support tray makes an angle of 90° or less with respect to the preparation position when the support tray is in the cleaning position.

5. The device as recited in claim 1, wherein a gravity center of each of the container bodies coincides with a rotation axis of the support tray when each of the container bodies is placed on the support tray.

6. The device as recited in claim 1, further comprising:
   a lamp unit arranged within the cleaning chamber to irradiate light.

7. The device as recited in claim 6, wherein the lamp unit includes a lamp base, a lamp installed on the lamp base and a transparent tube arranged around the lamp in a spaced-apart relationship.

8. The device as recited in claim 7, wherein the lamp base is removably attached to the housing.

9. The device as recited in claim 7, further comprising:
   a dry gas injector unit arranged to inject a dry gas into the cleaning chamber.

10. The device as recited in claim 9, wherein the dry gas injector unit includes a dry gas source for holding the dry gas therein, a dry gas injector nozzle for injecting the dry gas supplied from the dry gas source into the cleaning chamber and a heater for heating the dry gas injected from the dry gas injector nozzle.

11. The device as recited in claim 10, wherein the heater comprises:
   a plurality of inlet holes in the transparent tube through which the dry gas injected from the dry gas injector nozzle is introduced to between the lamp and the transparent tube; and
   a plurality of outlet holes in the transparent tube through which the dry gas introduced to between the lamp and the transparent tube is discharged into the cleaning chamber.

12. The device as recited in claim 11, wherein the outlet holes are formed in two rows along a longitudinal direction of the transparent tube, the outlet holes in one row making an angle of from 60 to 120° with respect to the outlet holes in the other row.

13. The device as recited in claim 1, further comprising:
   a body right position sensing unit for sensing each of the container bodies and generating a body sensing signal when each of the container bodies is supported in a right position;
   a cover right position sensing unit for sensing each of the container covers and generating a cover sensing signal when each of the container covers is supported in a right position; and
   a controller responsive to the body sensing signal and the cover sensing signal for preventing rotation of the rotor if each of the container bodies or each of the container covers is determined not to be placed in the right position.

14. The device as recited in claim 1, further comprising:
   a safety unit for stopping the cleaning operation when the container bodies or the container covers are separated from the container holders, the safety unit including a separation sensing unit for sensing separation of the container bodies or the container covers from the container holders to generate a separation signal; and
   a control unit responsive to the separation signal for stopping rotation of the rotor.

15. The device as recited in claim 14, wherein the separation sensing unit includes a tension wire installed around the rotor and deformed when making contact with each of the container bodies or each of the container covers separated from the container holders and a photo sensor for sensing the deformation of the tension wire to generate the separation signal.

16. The device as recited in claim 15, further comprising: a warning unit for warning an operator of the separation of the container bodies or the container covers, the warning unit including at least one of a warning buzzer and a warning lamp operated under the control of the control unit.

17. The device as recited in claim 14, further comprising: a warning unit for warning an operator of the separation of the container bodies or the container covers, the warning unit including at least one of a warning buzzer and a warning lamp operated under the control of the control unit.

* * * * *